United States Patent
Kim

(10) Patent No.: US 10,290,835 B2
(45) Date of Patent: May 14, 2019

(54) DISPLAY PANEL AND A CUTTING METHOD THEREOF

(71) Applicant: Wuhan China Star Optoelectronics Semiconductor Display Technology Co., Ltd., Wuhan, Hubei (CN)

(72) Inventor: Young Su Kim, Guangdong (CN)

(73) Assignee: Wuhan China Star Optoelectronics Semiconductor Display Technology Co., Ltd., Wuhan, Hubei (CN)

(*) Notice: Subject to any disclaimer, the term of this patent is extended or adjusted under 35 U.S.C. 154(b) by 0 days.

(21) Appl. No.: 15/556,591

(22) PCT Filed: Aug. 17, 2017

(86) PCT No.: PCT/CN2017/097862
§ 371 (c)(1),
(2) Date: Sep. 7, 2017

(65) Prior Publication Data
US 2019/0027708 A1    Jan. 24, 2019

(30) Foreign Application Priority Data
Jul. 24, 2017   (CN) .......................... 2014 1 0607787

(51) Int. Cl.
*H01L 21/00*   (2006.01)
*H01L 51/56*   (2006.01)
*H01L 51/52*   (2006.01)

(52) U.S. Cl.
CPC .......... *H01L 51/56* (2013.01); *H01L 51/5293* (2013.01); *H01L 2251/566* (2013.01)

(58) Field of Classification Search
None
See application file for complete search history.

(56) References Cited

U.S. PATENT DOCUMENTS

| 9,461,267 | B2 | 10/2016 | Yi et al. | |
| 9,748,520 | B2 | 8/2017 | Yi et al. | |
| 2007/0188688 | A1* | 8/2007 | Hwang | G02F 1/133351 349/122 |
| 2008/0220151 | A1* | 9/2008 | Kataoka | H01L 51/56 427/66 |
| 2009/0303191 | A1* | 12/2009 | Yang | G06F 3/045 345/173 |

(Continued)

FOREIGN PATENT DOCUMENTS

| CN | 101613177 A | 12/2009 |
| CN | 106556947 A | 4/2017 |
| CN | 106681031 A | 5/2017 |

(Continued)

*Primary Examiner* — Angel Roman
(74) *Attorney, Agent, or Firm* — Andrew C. Cheng

(57) ABSTRACT

The present invention provides a display panel and a cutting method thereof. The method includes: providing a display mother board; packaging the display mother board to form a plurality of display daughter boards; cutting the display mother board to separate the plurality of display daughter boards and the display mother board; attaching a polarizer on the plurality of display daughter boards; and integrally cutting the plurality of display daughter boards and the polarizer along a first cutting line. Through the method above, the present invention can decrease the cutting processes of manufacturing display panel.

16 Claims, 7 Drawing Sheets

(56) References Cited

U.S. PATENT DOCUMENTS

2015/0311409 A1* 10/2015 Huang ................. G02F 1/1362
                                                      257/99
2016/0131944 A1*  5/2016 Endo .................... G02F 1/1341
                                                      349/42

FOREIGN PATENT DOCUMENTS

JP          2007127787 A     5/2007
JP          2007248594 A     9/2007

* cited by examiner

900

DISPLAY PANEL AND A CUTTING METHOD THEREOF

BACKGROUND

Technical Field

The present invention relates to display field, and more particularly, to a display panel and a cutting method thereof.

Description of Related Art

Organic Light-Emitting Diode (OLED) is known as Organic Electroluminescence Display (OELD) or Organic Light-Emitting Semiconductor. Characteristic of the OLED is self-emitting, and an OLED display does not need backlight as Thin Film Transistor Liquid Crystal Display (TFT LCD) does so both the viewing angle and brightness are high. OLED has low voltage requirement, high efficiency of power saving, rapid response, light weight, thin thickness, simple structure, and low cost, and is deemed as one of the most promising products in 21 century.

During the manufacturing process of the OLED display, it cannot include narrow border because of evaporation and package and the panel material is damaged because it conducts multiple panel cutting. The display panel has reliability problem such as chasm.

SUMMARY

The main technique problem that the present invention need to solve is to provide a display panel and a cutting method thereof so the cutting processes of manufacturing the display panel can be decreased.

For solving the problem above, the present invention adopts another embodiment that provides a cutting method of a display panel including: providing a display mother board; packaging the display mother board to form a plurality of display daughter boards; cutting the display mother board to separate the plurality of display daughter boards and the display mother board; attaching a polarizer on the plurality of display daughter boards; and integrally cutting the plurality of display daughter boards and the polarizer along a first cutting line.

For solving the problem above, the present invention adopts another embodiment that provides a cutting method of a display panel including: providing a display mother board; forming a plurality of display daughter boards on the display mother board; cutting the display mother board to separate the plurality of display daughter boards and the display mother board; attaching a polarizer on the plurality of display daughter boards; and integrally cutting the plurality of display daughter boards and the polarizer.

For solving the problem above, the present invention adopts another embodiment that provides display panel, manufactured by a method of cutting a display panel, the method including steps of: providing a display mother board; forming a plurality of display daughter boards on the display mother board; cutting the display mother board to separate the plurality of display daughter boards and the display mother board; attaching a polarizer on the plurality of display daughter boards; and integrally cutting the plurality of display daughter boards and the polarizer.

The benefit of the present invention is to attach the polarizer on the display daughter board before cutting the display daughter board and integrally cut the display daughter boards and the polarizer, comparing to that cutting the display daughter board and cutting the polarizer are two processes in the conventional art. The cutting process of manufacturing the display panel can be decreased.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure. In the case of no conflict, the following embodiments and the features thereof can be combined with each other.

For resolving the reliability problem resulting from the conventional manufacturing process of the display panel having multiple cutting processes, the first embodiment of the present invention provides a cutting method of the display panel including: providing a display mother board; forming a plurality of display daughter boards on the display mother board; cutting the display mother board to separate the plurality of display daughter boards and the display mother board; attaching a polarizer on the plurality of display daughter boards; and integrally cutting the plurality of display daughter boards and the polarizer. There is detailed explanation below.

Figure 1:
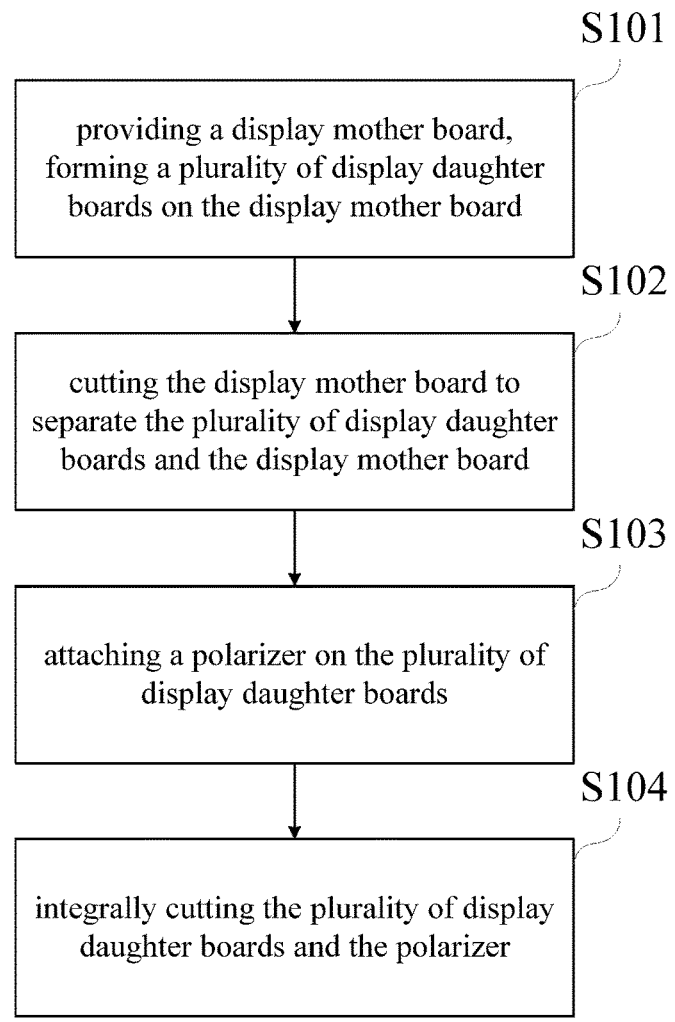
FIG. 1 is a flow chart of a method of cutting a display panel in accordance with a first embodiment of the present invention.
Figure 2:
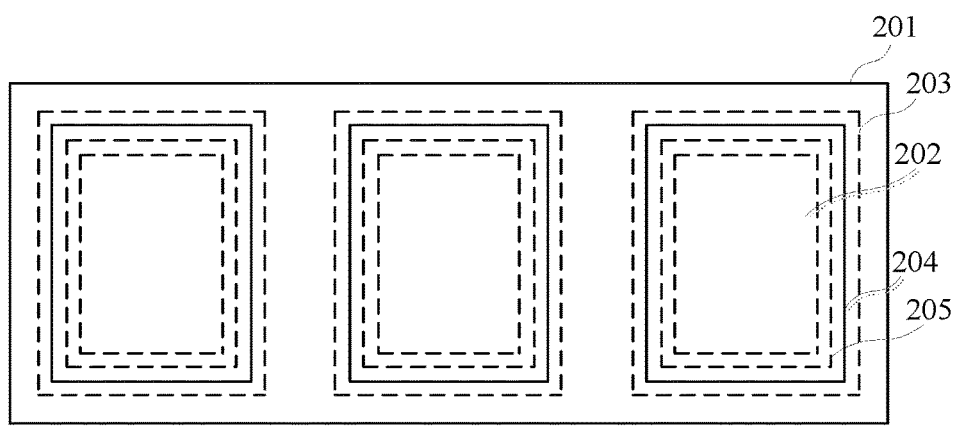
FIG. 2 is a structure schematic view of the flow chart of a method of cutting a display panel as shown in FIG. 1.

Referring FIGS. 1 and 2, FIG. 1 is a flow chart of a method of cutting a display panel in accordance with a first embodiment of the present invention, and FIG. 2 is a structure schematic view of the flow chart of a method of cutting a display panel as shown in FIG. 1.

S101: providing a display mother board 201, forming a plurality of display daughter boards 202 on the display mother board 201.

In this embodiment, it performs evaporation and package on the display mother board 201 to form the plurality of display daughter boards 202. It can be understood by the person skilled in the art that the evaporation and the package are conventional arts so it is not iterated.

Optionally, the quantity of the display daughter board 202 is decided by the final size of the display panel and the size of the display mother board 201. It is not limited.

S102: cutting the display mother board 201 to separate the plurality of display daughter boards 202 and the display mother board 201.

In this embodiment, the display mother board 201 is cut along a second cutting line 203 to separate the plurality of display daughter boards 202 and the display mother board 201. Optionally, it can adopt diamond tool or laser to cut the display mother board 201. It is not limited.

Optionally, the second cutting line 203 can be set about contour of the display daughter boards 202.

S103: attaching a polarizer 204 on the plurality of display daughter boards 202.

In this embodiment, attaching the polarizer 204 on the plurality of display daughter boards 202 is to assist the display daughter board 202 to form picture. The polarizer 204 can be the most middle PVA, two layers of TAC, PSA film, release film, or protective film. It can be understood by the person skilled in the art that the polarizer 204 can be other structures that can perform polarization. Those are belonged to the polarizer 204 described in this embodiment.

S104: integrally cutting the plurality of display daughter boards 202 and the polarizer 204.

In this embodiment, the plurality of display daughter boards 202 and the polarizer 204 are cut along a first cutting line 205. The first cutting line 205 is set about contour of the display daughter board 202.

In this embodiment, the plurality of display daughter boards 202 and the polarizer 204 are cut. The precision of the cutting is higher than that of cutting the display mother board 201. Optionally, it can adopt laser to cut the display daughter board 202 or other cutting methods which have high cutting precision. It is not limited.

Optionally, the graph enclosed by the first cutting line 205 can be any kind of polygon such as square or hexagon. The first cutting line 205 is set about contour of the display daughter board 202. The graph enclosed by the first cutting line 205 is decided by the contour of the display daughter board 202. If contour of the display daughter board 202 is square, the graph enclosed by the first cutting line 205 is square, and so on.

Optionally, the first cutting line 205 is to further design the contour of the display daughter board 202, and the second cutting line 203 is to design the probable location of the display daughter board 202 on the display mother board 201. Thus, area of the graph enclosed by the second cutting line 203 is larger than that of the graph enclosed by the first cutting line 205.

As the description above, the present invention attaches the polarizer on the display daughter board before cutting the display daughter board and combines the processes of cutting the display daughter board and the polarizer to be one process so the cutting processes of manufacturing the display panel can be decreased.

Figure 3:
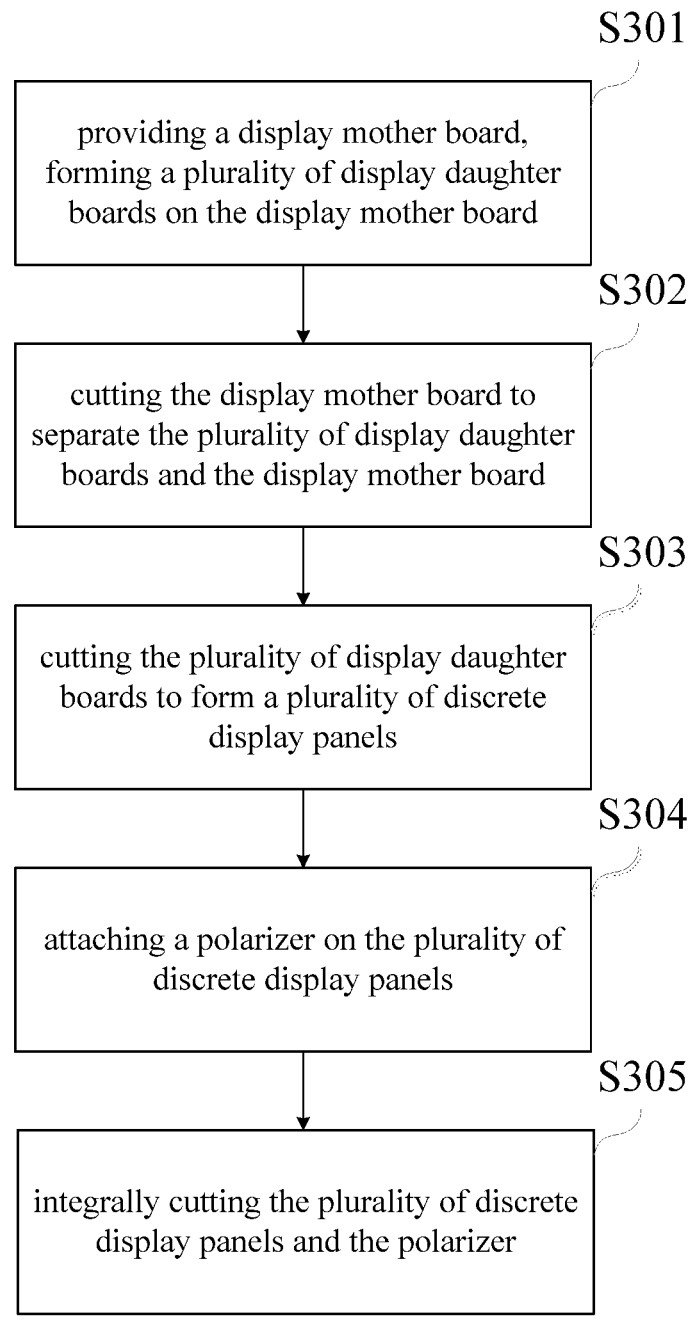
FIG. 3 is a flow chart of a method of cutting a display panel in accordance with a second embodiment of the present invention.
Figure 4:
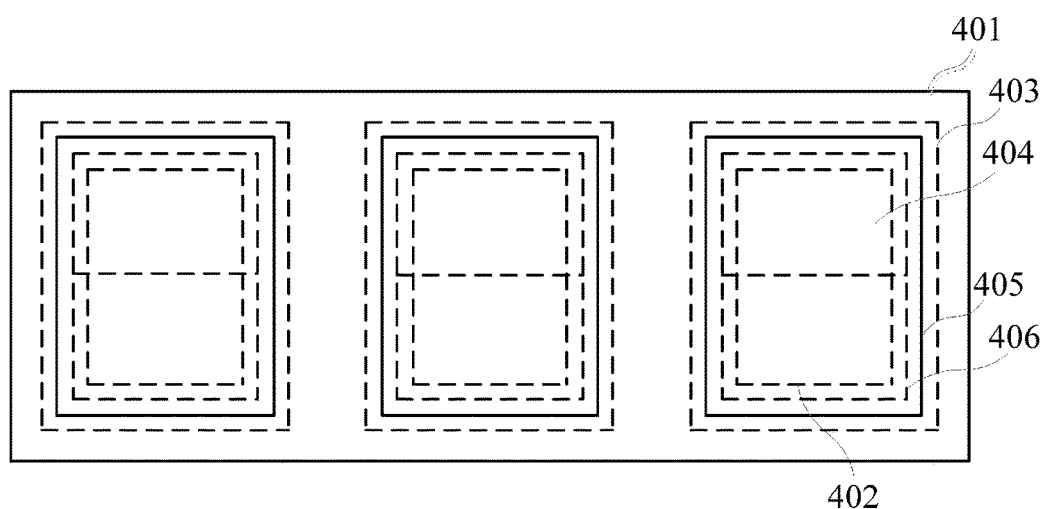
FIG. 4 is a structure schematic view of the flow chart of a method of cutting a display panel as shown in FIG. 3.

Referring to FIGS. 3 and 4, FIG. 3 is a flow chart of a method of cutting a display panel in accordance with a second embodiment of the present invention. FIG. 4 is a structure schematic view of the flow chart of a method of cutting a display panel as shown in FIG. 3.

S301: providing a display mother board 401, forming a plurality of display daughter boards 402 on the display mother board 401.

In this embodiment, it performs evaporation and package on the display mother board 401 to form the plurality of display daughter boards 402. It can be understood by the person skilled in the art that the evaporation and the package are conventional arts so it is not iterated.

Optionally, the quantity of the display daughter board 402 is decided by the final size of the display panel and the size of the display mother board 401. It is not limited.

S302: cutting the display mother board 401 to separate the plurality of display daughter boards 402 and the display mother board 401.

In this embodiment, the display mother board 401 is cut along a second cutting line 403 to separate the plurality of display daughter boards 402 and the display mother board 401. Optionally, it can adopt diamond tool or laser to cut the display mother board 401. It is not limited.

Optionally, the second cutting line 403 can be set about contour of the display daughter boards 402.

S303: cutting the plurality of display daughter boards 402 to form a plurality of discrete display panels 404.

In this embodiment, the plurality of display daughter boards 402 is cut to form the plurality of discrete display panels 404. Optionally, it can adopt diamond tool or laser to cut the plurality of display daughter boards 402. It is not limited. It can be understood by the person skilled in the art that one display daughter board 402 can be cut to form the plurality of discrete display panels 404. For instance, one display daughter boards 402 of 60 $in^2$ can be cut to form four discrete display panels 404 of 30 $in^2$. This embodiment is for disclosure. It does not investigate the reasonableness and realization.

S304: attaching a polarizer 405 on the plurality of discrete display panels 404.

In this embodiment, attaching the polarizer 405 on the plurality of discrete display panels 404 is to assist the discrete display panels 404 to form picture. The polarizer 405 can be the most middle PVA, two layers of TAC, PSA film, release film, or protective film. It can be understood by the person skilled in the art that the polarizer 405 can be other structures that can perform polarization. Those are belonged to the polarizer 405 described in this embodiment.

S305: integrally cutting the plurality of discrete display panels 404 and the polarizer 405.

In this embodiment, the plurality of discrete display panels 404 and the polarizer 405 are cut along a first cutting line 406. The first cutting line 406 is set about contour of the discrete display panel 404.

In this embodiment, the plurality of discrete display panels 404 and the polarizer 405 are cut. The precision of the cutting is higher than that of cutting the display mother board 401. Optionally, it can adopt laser to cut the plurality of discrete display panels 404 and the polarizer 405 or other cutting methods which have high cutting precision. It is not limited.

Optionally, the graph enclosed by the first cutting line 406 can be any kind of polygon such as square or hexagon. The first cutting line 406 is set about contour of the discrete display panels 404. The graph enclosed by the first cutting line 406 is decided by the contour of the discrete display panels 404. If contour of the discrete display panels 404 is square, the graph enclosed by the first cutting line 406 is square, and so on.

Optionally, the first cutting line 406 is to further design the contour of the discrete display panels 404, and the second cutting line 403 is to design the probable location of the display daughter board 402 on the display mother board 401. Thus, area of the graph enclosed by the second cutting line 403 is larger than that of the graph enclosed by the first cutting line 406.

Figure 5:
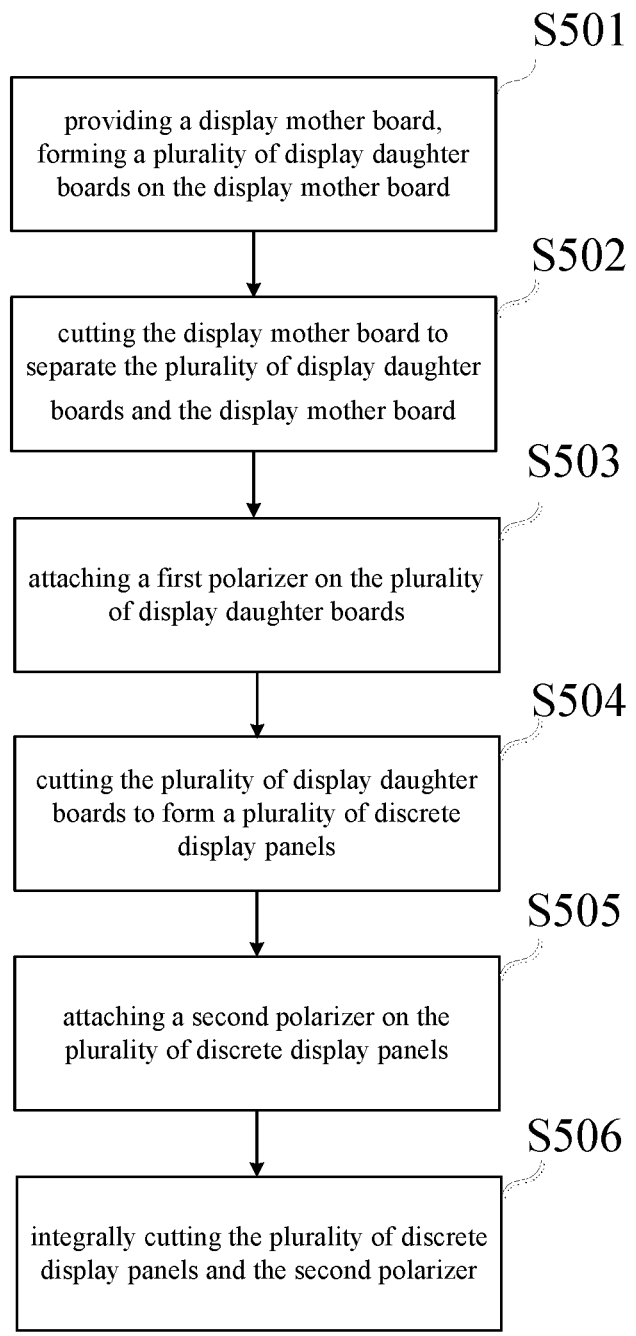
FIG. 5 is a flow chart of a method of cutting a display panel in accordance with a third embodiment of the present invention.
Figure 6:
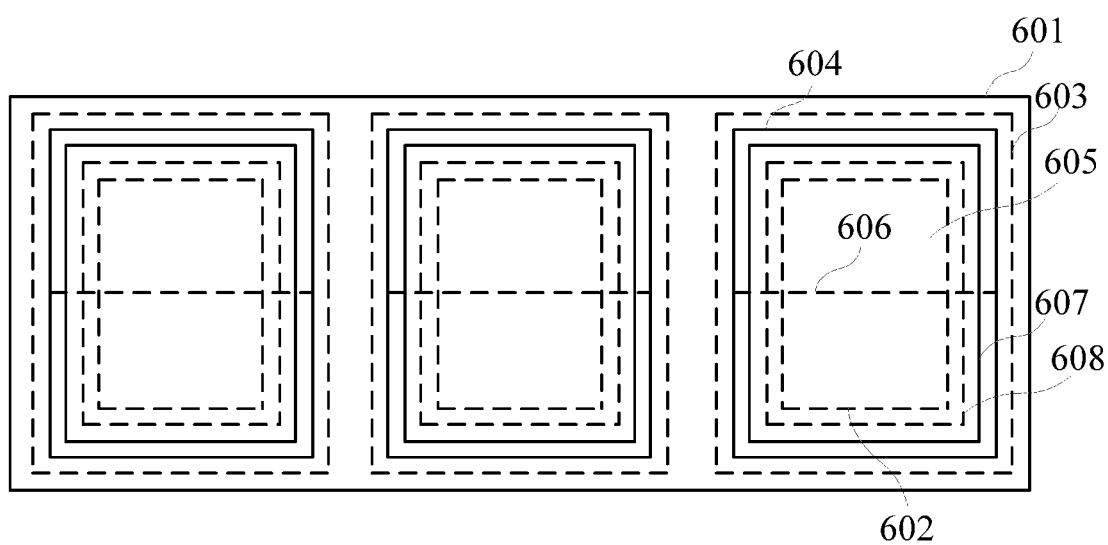
FIG. 6 is a structure schematic view of the flow chart of a method of cutting a display panel as shown in FIG. 5.

Referring FIGS. 5 and 6, FIG. 5 is a flow chart of a method of cutting a display panel in accordance with a third embodiment of the present invention. FIG. 6 is a structure schematic view of the flow chart of a method of cutting a display panel as shown in FIG. 5.

S501: providing a display mother board 601, forming a plurality of display daughter boards 602 on the display mother board 601.

In this embodiment, it performs evaporation and package on the display mother board 601 to form the plurality of display daughter boards 602. It can be understood by the person skilled in the art that the evaporation and the package are conventional arts so it is not iterated.

Optionally, the quantity of the display daughter board 602 is decided by the final size of the display panel and the size of the display mother board 601. It is not limited.

S502: cutting the display mother board 601 to separate the plurality of display daughter boards 602 and the display mother board 601.

In this embodiment, the display mother board 601 is cut along a second cutting line 603 to separate the plurality of display daughter boards 602 and the display mother board 601. Optionally, it can adopt diamond tool or laser to cut the display mother board 601. It is not limited.

Optionally, the second cutting line 603 can be set about contour of the display daughter boards 602.

S503: attaching a first polarizer 604 on the plurality of display daughter boards 602.

In this embodiment, attaching the first polarizer 604 on the plurality of display daughter boards 602 is to assist the display daughter board 602 to form picture. The first polarizer 604 can be the most middle PVA, two layers of TAC, PSA film, release film, or protective film. It can be understood by the person skilled in the art that the first polarizer 604 can be other structures that can perform polarization. Those are belonged to the first polarizer 604 described in this embodiment.

S504: cutting the plurality of display daughter boards 602 to form a plurality of discrete display panels 605.

In this embodiment, the plurality of display daughter boards 602 is cut along a third cutting line 606 to form the plurality of discrete display panels 605. The third cutting line 606 is along the border among the plurality of discrete display panels 605. Optionally, it can adopt diamond tool or laser to cut the plurality of display daughter boards 602. It is not limited. It can be understood by the person skilled in the art that one display daughter board 602 can be cut to form the plurality of discrete display panels 605. For instance, one display daughter boards 602 of 60 in$^2$ can be cut to form four discrete display panels 605 of 30 in$^2$. This embodiment is for disclosure. It does not investigate the reasonableness and realization.

S505: attaching a second polarizer 607 on the plurality of discrete display panels 605.

In this embodiment, the second polarizer 607 has the same structure as the first polarizer 604. It is not iterated.

S506: integrally cutting the plurality of discrete display panels 605 and the second polarizer 607.

In this embodiment, the plurality of discrete display panels 605 and the second polarizer 607 are cut along a first cutting line 608. The first cutting line 608 is set about contour of the discrete display panel 605.

In this embodiment, the plurality of discrete display panels 605 and the second polarizer 607 are cut. The precision of the cutting is higher than that of cutting the display mother board 601. Optionally, it can adopt laser to cut the plurality of discrete display panels 605 and the second polarizer 607 or other cutting methods which have high cutting precision. It is not limited.

Optionally, the graph enclosed by the first cutting line 608 can be any kind of polygon such as square or hexagon. The first cutting line 608 is set about contour of the discrete display panels 605. The graph enclosed by the first cutting line 608 is decided by the contour of the discrete display panels 605. If contour of the discrete display panels 605 is square, the graph enclosed by the first cutting line 608 is square, and so on.

Optionally, the first cutting line 608 is to further design the contour of the discrete display panels 605, and the second cutting line 603 is to design the probable location of the display daughter board 602 on the display mother board 601. Thus, area of the graph enclosed by the second cutting line 603 is larger than that of the graph enclosed by the first cutting line 608.

Figure 7:
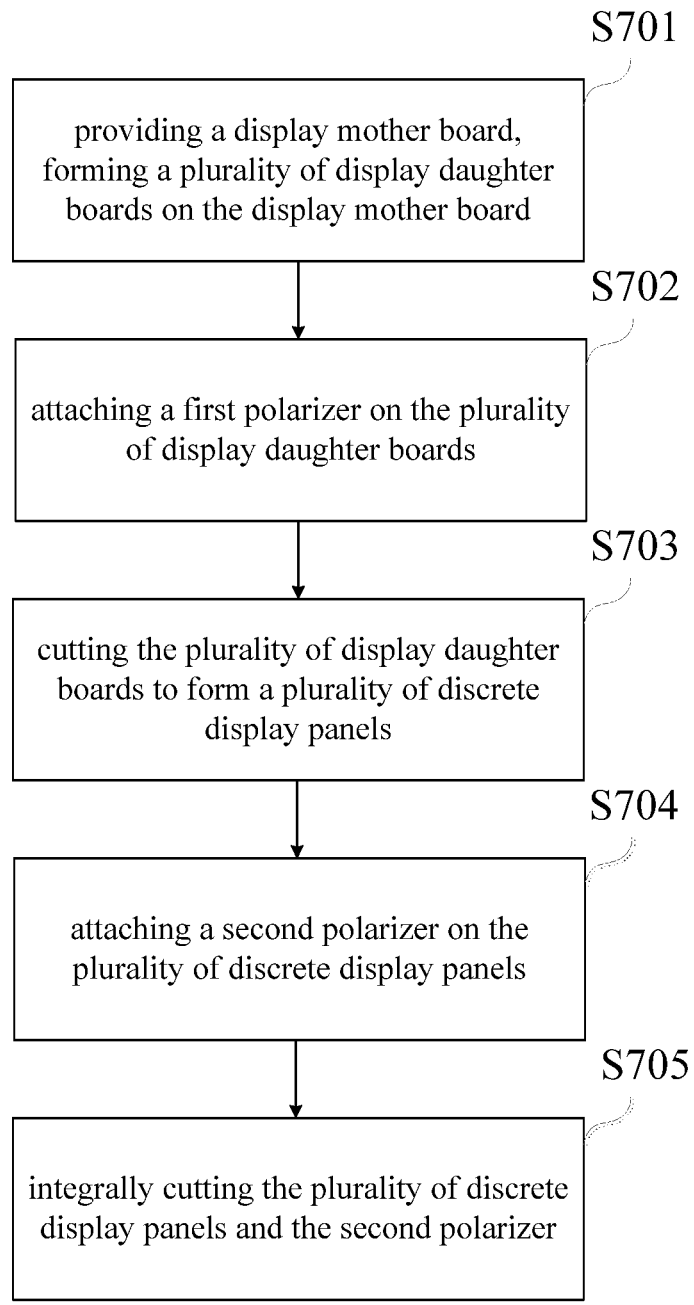
FIG. 7 is a flow chart of a method of cutting a display panel in accordance with a forth embodiment of the present invention.
Figure 8:
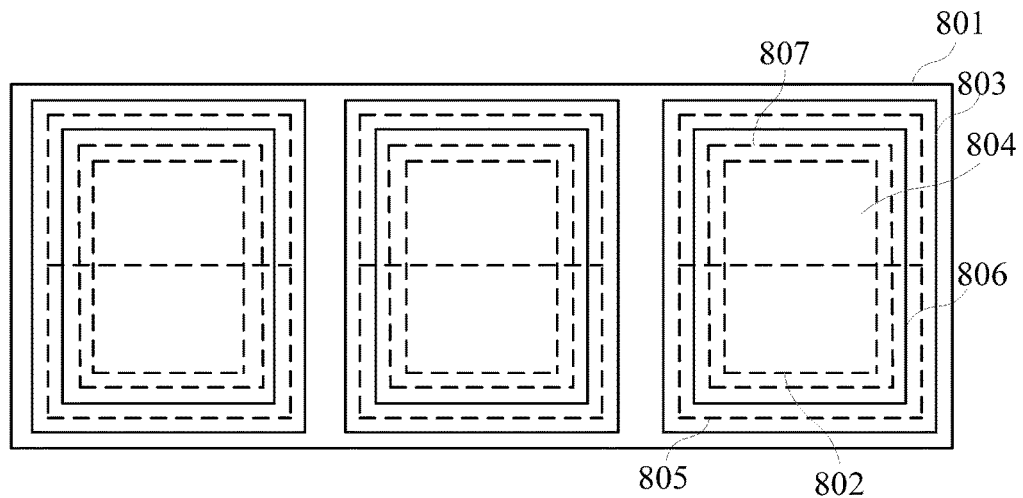
FIG. 8 is a structure schematic view of the flow chart of a method of cutting a display panel as shown in FIG. 7.

Referring FIGS. 7 and 8, FIG. 7 is a flow chart of a method of cutting a display panel in accordance with a forth embodiment of the present invention. FIG. 8 is a structure schematic view of the flow chart of a method of cutting a display panel as shown in FIG. 7.

S701: providing a display mother board 801, forming a plurality of display daughter boards 802 on the display mother board 801.

In this embodiment, it performs evaporation and package on the display mother board 801 to form the plurality of display daughter boards 802. It can be understood by the person skilled in the art that the evaporation and the package are conventional arts so it is not iterated.

Optionally, the quantity of the display daughter board 802 is decided by the final size of the display panel and the size of the display mother board 801. It is not limited.

S702: attaching a first polarizer 803 on the plurality of display daughter boards 802.

In this embodiment, attaching the first polarizer 803 on the plurality of display daughter boards 802 is to assist the display daughter board 602 to form picture. The first polarizer 803 can be the most middle PVA, two layers of TAC, PSA film, release film, or protective film. It can be understood by the person skilled in the art that the first polarizer 803 can be other structures that can perform polarization. Those are belonged to the first polarizer 803 described in this embodiment.

S703: cutting the plurality of display daughter boards 802 to form a plurality of discrete display panels 804.

In this embodiment, the plurality of display daughter boards 802 is cut along a third cutting line 805 to form the plurality of discrete display panels 804. The third cutting line 805 is along the border among the plurality of discrete display panels 804. Optionally, it can adopt diamond tool or laser to cut the plurality of display daughter boards 804. It is not limited. It can be understood by the person skilled in the art that one display daughter board 802 can be cut to form a plurality of discrete display panels 804. For instance, one display daughter boards 802 of 60 in$^2$ can be cut to form four discrete display panels 804 of 30 in$^2$. This embodiment is for disclosure. It does not investigate the reasonableness and realization.

S704: attaching a second polarizer 806 on the plurality of discrete display panels 804.

In this embodiment, the second polarizer 806 has the same structure as the first polarizer 804. It is not iterated.

S705: integrally cutting the plurality of discrete display panels 804 and the second polarizer 806.

In this embodiment, the plurality of discrete display panels 804 and the second polarizer 806 are cut along a first cutting line 807. The first cutting line 807 is set about contour of the discrete display panel 804.

Optionally, it can adopt laser to cut the plurality of discrete display panels 804 or other cutting methods which have high cutting precision. It is not limited.

Optionally, the graph enclosed by the first cutting line 807 can be any kind of polygon such as square or hexagon. The first cutting line 807 is set about contour of the discrete display panels 804. The graph enclosed by the first cutting line 807 is decided by the contour of the discrete display panels 804. If contour of the discrete display panels 804 is square, the graph enclosed by the first cutting line 807 is square, and so on.

Figure 9:
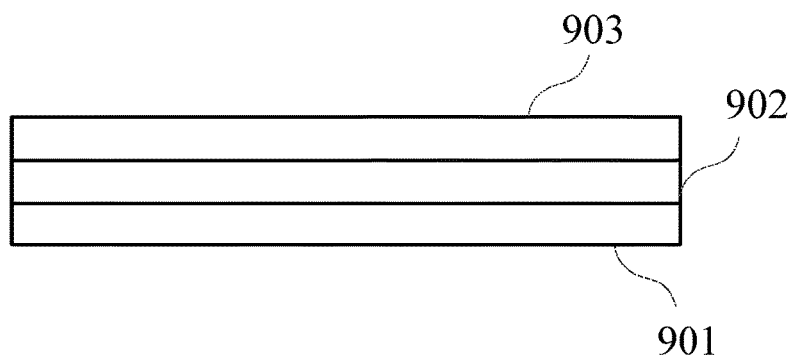
FIG. 9 is a structure schematic view of a display panel in accordance with an embodiment of the present invention.

Referring to FIG. 9, FIG. 9 is a structure schematic view of a display panel in accordance with an embodiment of the present invention.

A display panel 900 is formed by the method of cutting the display panel described above. It is not iterated.

In this embodiment, the display panel 900 includes a glass substrate 901, a buffer layer 902, and an array substrate 903. The buffer layer 902 is set on the glass substrate 901, and the array substrate 903 is set on a side of the buffer layer 902 far away from the glass substrate 901. Stability of the attachment between the buffer layer 902 and the array substrate 903 can be guaranteed because the display panel 900 is formed by the method of cutting the display panel described above. Problem of bad reliability will not occur.

As the description above, the present invention attaches the polarizer on the discrete display panel before cutting contour of the discrete display panel when the display daughter board needs to be cut to form the plurality of the discrete display panel. It combines the processes of cutting the discrete display panel and the polarizer to be one process so the cutting processes of manufacturing display panel can be decreased.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of cutting a display panel, comprising steps of:
   providing a display mother board;
   packaging the display mother board to form a plurality of display daughter boards;
   cutting the display mother board to separate the plurality of display daughter boards and the display mother board;
   attaching a polarizer on the plurality of display daughter boards; and
   integrally cutting the plurality of display daughter boards and the polarizer along a first cutting line,
   wherein an area of a graph enclosed by the first cutting line is smaller than an area of the polarizer.

2. The method of claim 1, wherein a graph enclosed by the first cutting line is polygon.

3. The method of claim 2, wherein integrally cutting the plurality of display daughter boards and the polarizer comprises adopting laser to integrally cut the plurality of display daughter boards and the polarizer.

4. The method of claim 1, wherein cutting the display mother board comprises cutting the display mother board along a second cutting line.

5. The method of claim 4, wherein an area of a graph enclosed by the second cutting line is larger than that of the graph enclosed by the first cutting line.

6. The method of claim 1, after attaching the polarizer on the plurality of display daughter boards, further comprising:
   cutting the plurality of display daughter boards to form at least two discrete display panels by laser; and
   integrally cutting the discrete display panels and the polarizer.

7. The method of claim 6, after cutting the plurality of display daughter boards to form at least two discrete display panels, further comprising:
   attaching a polarizer on the discrete display panels; and
   integrally cutting the discrete display panels and the polarizer.

8. A method of cutting a display panel, comprising steps of:
   providing a display mother board;
   forming a plurality of display daughter boards on the display mother board;
   cutting the display mother board to separate the plurality of display daughter boards and the display mother board;
   attaching a polarizer on the plurality of display daughter boards; and
   integrally cutting the plurality of display daughter boards and the polarizer along a first cutting line,
   wherein an area of a graph enclosed by the first cutting line is smaller than an area of the polarizer.

9. The method of claim 8, wherein a graph enclosed by the first cutting line is polygon.

10. The method of claim 9, wherein integrally cutting the plurality of display daughter boards and the polarizer comprises adopting laser to integrally cut the plurality of display daughter boards and the polarizer.

11. The method of claim 10, wherein cutting the display mother board comprises cutting the display mother board along a second cutting line.

12. The method of claim 11, wherein an area of a graph enclosed by the second cutting line is larger than that of the graph enclosed by the first cutting line.

13. The method of claim 8, wherein forming a plurality of display daughter boards on the display mother board comprises packaging the display mother board to form a plurality of display daughter boards.

14. The method of claim 8, after attaching the polarizer on the plurality of display daughter boards, further comprising:
   cutting the plurality of display daughter boards to form at least two discrete display panels by laser; and
   integrally cutting the discrete display panels and the polarizer.

15. The method of claim 14, after cutting the plurality of display daughter boards to form at least two discrete display panels further comprising:
   attaching a polarizer on the discrete display panels; and
   integrally cutting the discrete display panels and the polarizer.

16. A display panel, manufactured by a method of cutting a display panel, the method comprising steps of:
   providing a display mother board;
   forming a plurality of display daughter boards on the display mother board;

cutting the display mother board to separate the plurality of display daughter boards and the display mother board;
attaching a polarizer on the plurality of display daughter boards; and
integrally cutting the plurality of display daughter boards and the polarizer along a first cutting line,
wherein an area of a graph enclosed by the first cutting line is smaller than an area of the polarizer.

* * * * *